(12) United States Patent
Kamijima

(10) Patent No.: US 7,816,070 B2
(45) Date of Patent: Oct. 19, 2010

(54) SUBSTRATE USED FOR IMMERSION LITHOGRAPHY PROCESS, METHOD OF MANUFACTURING SUBSTRATE USED FOR IMMERSION LITHOGRAPHY PROCESS, AND IMMERSION LITHOGRAPHY

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 627 days.

(21) Appl. No.: 11/878,399

(22) Filed: Jul. 24, 2007

(65) Prior Publication Data

US 2008/0032230 A1 Feb. 7, 2008

(30) Foreign Application Priority Data

Aug. 2, 2006 (JP) .............................. 2006-210637

(51) Int. Cl.
*G03F 7/11* (2006.01)
(52) U.S. Cl. ................................. 430/273.1; 430/272.1
(58) Field of Classification Search .............. 430/270.1, 430/271.1, 272.1, 273.1
See application file for complete search history.

(56) References Cited

U.S. PATENT DOCUMENTS

2002/0110760 A1* 8/2002 Lin ............................ 430/322
2007/0066080 A1* 3/2007 Kugler et al. ............... 438/725

FOREIGN PATENT DOCUMENTS

| JP | A-2005-183709 | 7/2005 |
| JP | A-2006-019742 | 1/2006 |
| JP | A-2006-108564 | 4/2006 |
| JP | A-2006-186112 | 7/2006 |
| KR | 20030002323 | * 9/2003 |

* cited by examiner

*Primary Examiner*—Cynthia H Kelly
*Assistant Examiner*—Anca Eoff
(74) *Attorney, Agent, or Firm*—Oliff & Berridge, PLC

(57) ABSTRACT

A substrate having a photoresist film, capable of easily performing immersion lithography with high precision and stability, is provided. A surface tension of the substrate in a periphery region is lower than that of the substrate in a rest region. Immersion liquid supplied onto the photoresist film hardly leaks out, and the bubbles hardly occur in the immersion liquid.

4 Claims, 8 Drawing Sheets

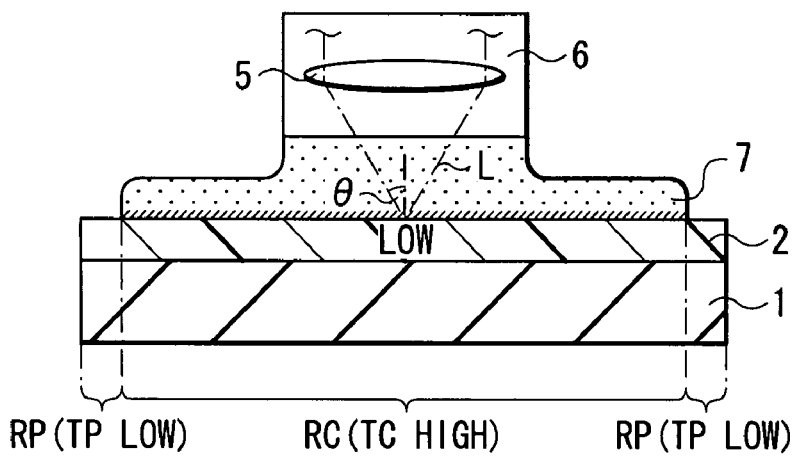
FIG. 7
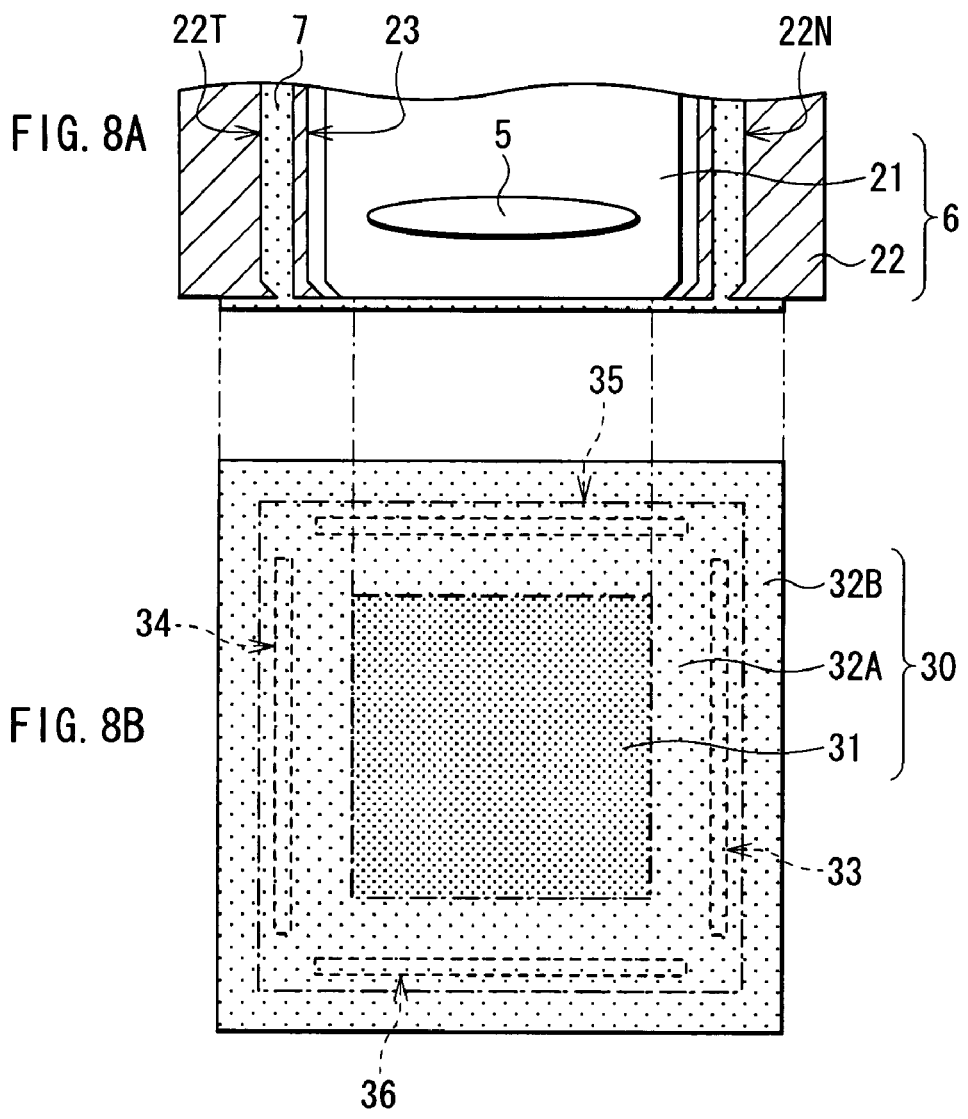
FIG. 8A
FIG. 8B

SUBSTRATE USED FOR IMMERSION LITHOGRAPHY PROCESS, METHOD OF MANUFACTURING SUBSTRATE USED FOR IMMERSION LITHOGRAPHY PROCESS, AND IMMERSION LITHOGRAPHY

BACKGROUND OF THE INVENTION

1. Field of the Invention

The present invention relates to a substrate used for immersion lithography process used in an immersion lithography process and a method of manufacturing thereof, and immersion lithography using thereof.

2. Description of the Related Art

In the filed of manufacturing various devices such as semiconductors and magnetic heads, photolithography has been widely used in a forming process of fine patterns. Photolithography is generally a method of forming a photo-sensitive film (photoresist film) on a substructure and selectively exposing and developing the photoresist film using a photomask. By photolithography, a pattern shape of a photomask is transcribed to the photoresist film so that patterning is performed on the photoresist film in reflection of the pattern shape.

With respect to the resolution of photolithography, further improvement is desirable due to a rapid size reduction of the device in recent years. Therefore immersion lithography has attracted attention as an exposure method capable of improving the resolution. Immersion lithography is a method of exposing such that liquid (namely, immersion liquid) fills between a projection lens of an exposure device (stepper) and a photoresist film. In immersion lithography, the resolution additionally improves due to contribution of refractive index of the immersion liquid in comparison with the case of exposing in air without using the immersion liquid.

With respect to immersion lithography, several related techniques have already been proposed. Specifically, in case of using water-type immersion liquid, hydrophobic technique of oxidizing the surface of the photoresist film in order to prevent occurrence of bubbles (micro-bubbles) in the immersion liquid has been known (for example, refer to Japanese Unexamined Patent Publication No. 2006-108564).

Also, a technique to improve a specific problem in immersion lithography, that is, an antinomic problem occurred due to a contact of the photoresist film with the immersion liquid has been known (for example, refer to Japanese Unexamined Patent Publication No. 2006-019742). Specifically, when focusing on the surface tension of the photoresist film, if the surface tension is low (wetting of the immersion liquid is poor), immersion liquid hardly leaks out from the exposed area but bubbles are easily produced in the immersion liquid. On the other hand, if the surface tension of the photoresist film is high (wetting of the immersion liquid is good), bubbles are hardly produced but the immersion liquid easily leaks out from the exposed area. Thus after supplying the immersion liquid on the photoresist film, an interface activating gas substance is supplied to the immersion liquid. By forming a mixed substance having a low surface tension, between the photoresist film and the immersion liquid, the surface tension gradient pulling the immersion liquid is generated.

SUMMARY OF THE INVENTION

Immersion lithography in the related art forming mixed substance having a low surface tension between the photoresist film and the immersion liquid is extremely useful to perform immersion lithography with high precision. However, there is still room in immersion lithography from a viewpoint of improving stability of surface tension (namely, interfacial tension) of the photoresist film in the immersion liquid, and simplifying the immersion lithography process. Specifically, because the third layer (mixed substance) is formed by mixing the immersion liquid and the gas substance, the desirable surface tension may be unobtainable due to various mixture ratios and the like. Also, the state of the immersion is completed by a contact of the photoresist film with the immersion liquid. Then the relationship between the surface tension of the photoresist film and the surface tension of the immersion liquid is adjusted afterward so that the immersion lithography process becomes complicated.

In view of the foregoing, it is desirable to provide the substrate used for immersion lithography process capable of easily performing immersion lithography with high precision and stability and a method of manufacturing thereof, and immersion lithography.

In the substrate having a photoresist film, used for immersion lithography process according to an embodiment of the present invention, a surface tension of the substrate in a periphery region is lower than that of the substrate in a rest region. Also, a method of manufacturing the substrate used for immersion lithography process according to an embodiment of the present invention is a method of manufacturing the substrate used for immersion lithography process having the photoresist film, and the surface tension of the substrate in the periphery region is decreased as compared with that of the substrate in a rest region. Further, the method of immersion lithography according to an embodiment of the present invention includes the steps of supplying the immersion liquid onto the rest region on the substrate used for immersion lithography process described above, and exposing the photoresist film through the immersion liquid with a use of an exposure device.

In the substrate used for immersion lithography process or the method of manufacturing thereof, or immersion lithography, the surface tension of the periphery region becomes lower than that of the rest region before the immersion liquid is supplied, that is, before the immersion is completed. In this case, wetting of the immersion liquid is poor in the periphery region, and the immersion liquid hardly flows from the rest region to the periphery region so that the immersion liquid hardly leaks out. Also, wetting of the immersion liquid is good in the rest region and air hardly gets in between the photoresist film and the immersion liquid so that bubbles are hardly produced in the immersion liquid. Moreover, unlike the case where the mixed substance with the low surface tension is formed between the photoresist film and immersion liquid, a desirable surface tension is easily obtained because only surface modification and film formation showing a good reproducibility to control the surface tension are performed. Also, after the immersion is completed, the surface tension is unnecessary to be adjusted, thereby enabling the immersion lithography process to be simplified.

In the substrate used for immersion lithography process and the method of manufacturing thereof according to an embodiment of the present invention, magnitude of the surface tension is discontinuous between the periphery region and the rest region. Also, the interfacial tension between the substrate in the periphery region and the immersion liquid is preferably higher than that between the substrate in the rest region and the immersion liquid.

The substrate used for immersion lithography process according to an embodiment of the present invention may have the following configuration: (1) The photoresist film is formed both in the periphery region and the rest region, and a process to increase the surface tension is performed onto the surface of the photoresist film in rest region. The surface tension of the photoresist film in the periphery region may be lower than that of the photoresist film in the rest region. (2) The substrate is formed of the photoresist film and a substructure supporting the photoresist film. The photoresist film is formed in the rest region, while the substructure is exposed in the periphery region. The surface tension of the exposed surface of the substructure in the periphery region may be lower than that of the photoresist film in the rest region. (3) The photoresist film is formed both in the periphery region and the rest region, and a process to increase the surface tension is performed onto the surface of the photoresist film in the rest region. Also, a surface tension decreasing film is formed on the photoresist film in the periphery region and the surface tension of the surface tension decreasing film in the periphery region may be lower than that of the photoresist film in the rest region. In this case, the surface tension decreasing film may be composed of at least one selected from the group consisting of fluororesin and silicon resin. (4) The substrate is formed of the photoresist film and a substructure supporting the photoresist film. The photoresist film is formed in the rest region, while the substructure is partially exposed in the periphery region. Also, a process to decrease the surface tension is performed onto the exposed surface of the substructure and the surface tension of the exposed surface of the substructure in the periphery region may be lower than that of the photoresist film in the rest region.

In the method of manufacturing the substrate used for immersion lithography process according to an embodiment of the present invention, the following steps may be taken: (1) The method may include the steps of forming the photoresist film both in the periphery region and in the rest region, and performing the process to increase the surface tension onto the surface of the photoresist film in the rest region. Thereby the surface tension of the photoresist film in the periphery region may be decreased as compared with that of the photoresist film in the rest region. (2) The method may include the steps of forming the photoresist film on the substructure both in the periphery region and in the rest region, performing the process to increase the surface tension onto the surface of the photoresist film both in the periphery region and in the rest region, and removing the photoresist film in the periphery region to partially expose the substructure. Thereby the surface tension of the exposed surface of the substructure in the periphery region may be decreased as compared with that of the photoresist film in the rest region. (3) The method may include the steps of forming the photoresist film both in the periphery region and in the rest region, performing the process to increase the surface tension onto the surface of the photoresist film both in the periphery region and the rest region, and forming the surface tension decreasing film on the photoresist film in the periphery region where the surface tension has been increased. The surface tension of the surface tension decreasing film in the periphery region may be decreased as compared with that of the photoresist film in the rest region. In this case, the surface tension decreasing film may be composed of at least one selected from the group consisting of fluororesin and silicon resin. (4) The method may include the steps of forming the photoresist film on the substructure in the periphery region and the rest region, performing the process to increase the surface tension on the surface of the photoresist film at least in the rest region, and removing the photoresist film in the periphery region through a use of a surface tension depressant to partially expose the substructure, thereby decreasing the surface tension of the surface of the substructure exposed. Thereby the surface tension of the exposed surface of the substructure in the periphery region may be decreased as compared with that of the photoresist film in the rest region. In this case, the process to increase the surface tension is performed onto the surface of the photoresist film both in the periphery region and in the rest region, and then the photoresist film in the periphery region may be removed, or the photoresist film in the periphery region is removed and then the process to increase the surface tension may be performed onto the surface of the photoresist film in the rest region. Also, a solvent including at least one selected from the group consisting fluororesin and silicon resin may be used as the surface tension depressant. In the above-described (1) to (4), oxidization of the surface of the photoresist film is performed as the process to increase the surface tension.

In the substrate used for immersion lithography process and the method of manufacturing thereof, and immersion lithography according to an embodiment of the present invention, the surface tension of the periphery region is lower than that of the rest region before the immersion is completed so that immersion lithography can be easily performed with high precision and stability.

Other and further objects, features and advantages of the invention will appear more fully from the following description.

BRIEF DESCRIPTION OF THE DRAWINGS

FIG. 7 is a cross sectional view illustrating a step following FIG. 6.

FIGS. 8A and 8B are views illustrating a supply method and supply range of the immersion liquid.

DETAILED DESCRIPTION OF THE PREFERRED EMBODIMENTS

Hereinafter, preferred embodiments of the present invention will be described in detail with reference to the accompanying drawings.

First Embodiment

Figure 1:
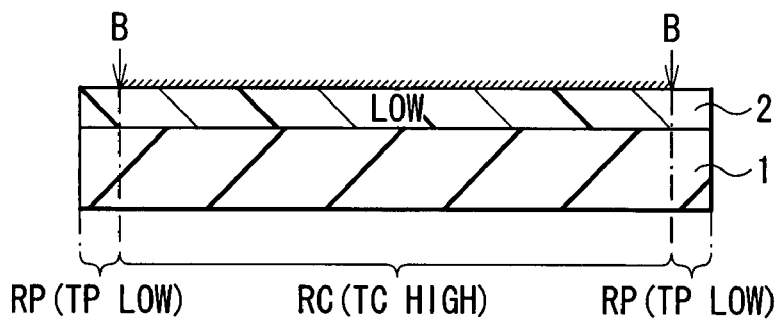
FIG. 1 is a cross sectional view showing a configuration of a substrate used for immersion lithography process according to a first embodiment of the present invention.
Figure 2:
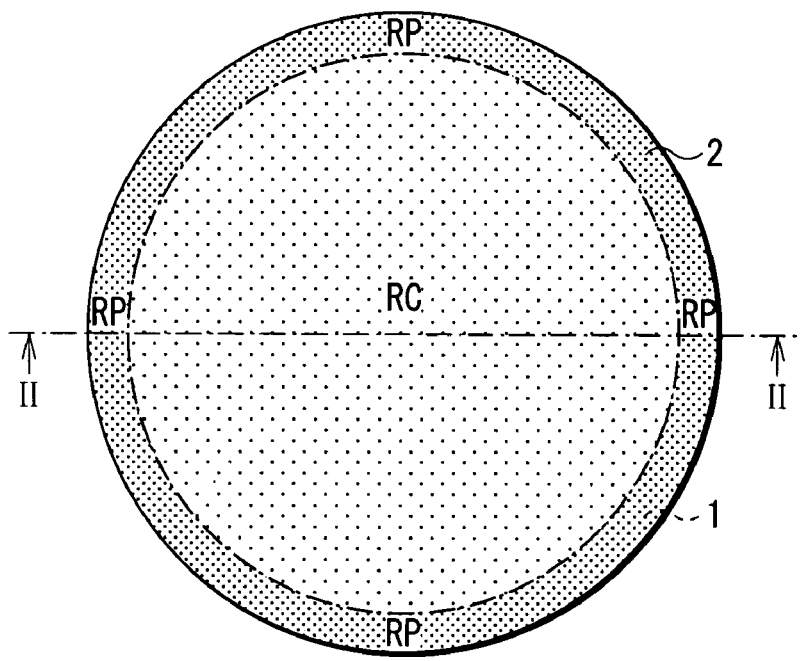
FIG. 2 is a plan view showing another configuration of the substrate used for immersion lithography process shown in FIG. 1.
Figure 3:
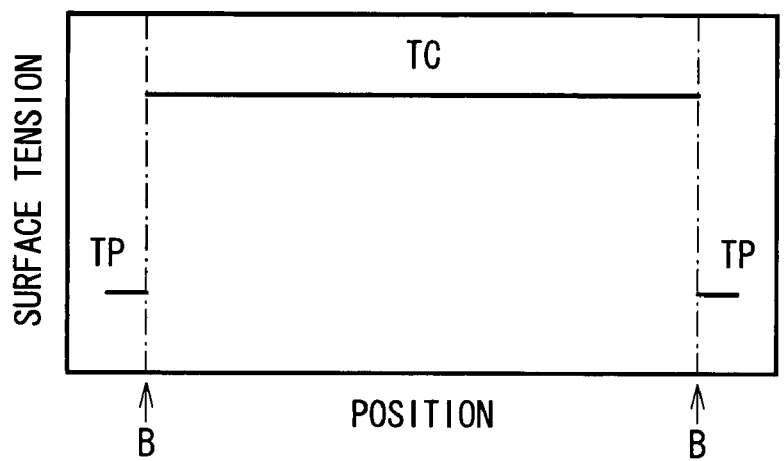
FIG. 3 is a view illustrating a distribution of a surface tension of the substrate used for immersion lithography process shown in FIG. 1

With reference to FIGS. 1 to 3, a substrate used for immersion lithography process according to a first embodiment of the present invention will be described. FIGS. 1 to 3 illustrate a configuration of a substrate used for immersion lithography process, FIG. 1 showing a cross sectional configuration, FIG. 2 showing a planar configuration, and FIG. 3 showing a distribution of surface tension, respectively. In addition, FIGS. 1 to 3 show a cross section and distribution taken along the line □-□ of FIG. 2, respectively.

The substrate is used in immersion lithography. As shown in FIGS. 1 and 2, the substrate used for immersion lithography process has, on a substructure 1, a photoresist film 2 subjected to patterning by immersion lithography. The surface region of the substrate used for immersion lithography process is divided into a periphery region RP and the region other than the periphery region RP (a central region RC). The periphery region RP is the region surrounding the central region RC (the darkly shaded region in FIG. 2). The central region RC is the region surrounded by the periphery region RP (the lightly shaded region in FIG. 2), where the supplied immersion liquid is stabilized during exposure.

In the substrate used for immersion lithography process, a surface tension TP of the periphery region RP is lower than a surface tension TC of the central region RC. Here, for example, a photoresist film 2 is formed on the substructure 1 in the periphery region RP and the central region RC. Thus the surface tension TP is the surface tension of the photoresist film 2 in the periphery region RP, and the surface tension TC is the surface tension of the photoresist film 2 in the central region RC.

In particular, when focusing on the interfacial tension between the immersion liquid and the photoresist film 2 of the substrate used for immersion lithography process, the interfacial tension in the periphery region RP is higher than the interfacial tension in the central region RC. That is, wetting of the immersion liquid with the photoresist 2 is poor in the periphery region RP, and wetting of the immersion liquid with the photoresist film 2 is good in the central region RC.

Here, for example, the surface of the photoresist film 2 originally has a property that wetting is poor. Accordingly, the surface of the photoresist film 2 in the central region RC is modified so that wetting is good. Thus the surface tension TP becomes lower than the surface tension TC. "Originally" in the above means the initial state of the physical property that the surface modification has not yet been performed.

More specifically, as shown in FIG. 3, each of the surface tension TP and the surface tension TC is almost constant. They are discontinuous in a boundary position B between the periphery region RP and the central region RC. "Almost constant" in the above does not limitedly mean that each of the surface tension TP and the surface tension TC is strictly constant. It includes some tolerance as long as they are set with an intention to make them constant.

For convenience, when referring a surface tension property of the substrate used for immersion lithography process, the surface tension showing poor wetting with the immersion liquid refers to as "low surface tension" and the surface tension showing a good wetting with the immersion liquid refers to as "high surface tension", respectively. In FIG. 1, "Low" after "TP" means that the surface tension TP is a low surface tension and "High" after "TC" means that the surface tension TC is a high surface tension, respectively. Also, oblique lines over the surface of the photoresist film 2 in the central region RC mean that the surface is modified. In addition, "Low" (or "High") in a component (in FIG. 1, the photoresist film 2) of the substrate used for immersion lithography process means that the component originally has a low surface tension (or high surface tension). Same references as described above are same in the other views, after this.

In FIG. 2, the case is shown where a planar configuration of the substructure 1 or the like is circular shaped, but the shape is not limited to circular. It can be set arbitrarily.

Figure 4:
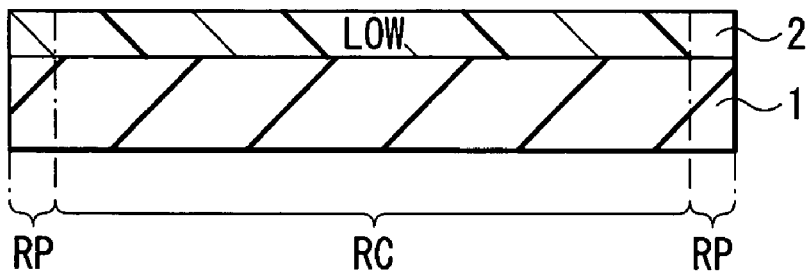
FIG. 4 is a cross sectional view illustrating a step in a method of manufacturing the substrate used for immersion lithography process shown in FIG. 1.
Figure 5:
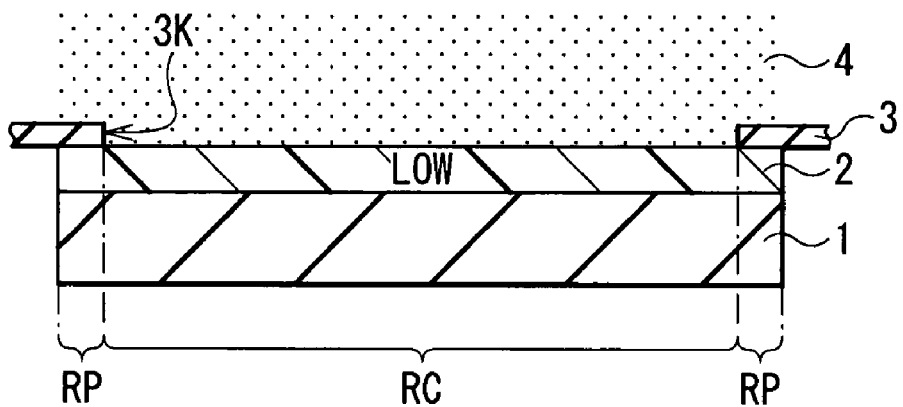
FIG. 5 is a cross sectional view illustrating a step following FIG. 4
Figure 6:
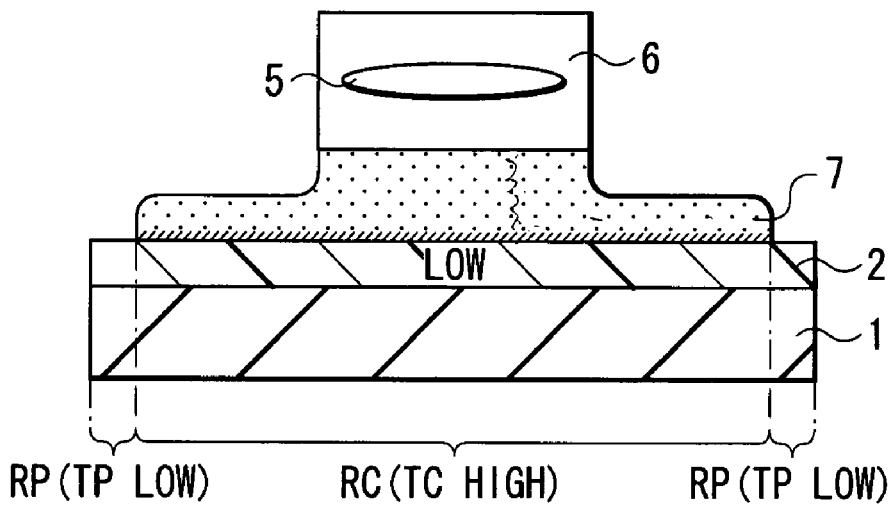
FIG. 6 is a cross sectional view illustrating a step in immersion lithography using the substrate used for immersion lithography process shown in FIG. 1.

Next, with reference to FIG. 1 to FIGS. 8A and 8B, a method of manufacturing the substrate used for immersion lithography process and immersion lithography using thereof shown in FIGS. 1 to 3 will be described. FIGS. 4 and 5 illustrate a process of manufacturing the substrate used for immersion lithography process, and FIGS. 6 and 7 illustrate an immersion lithography process, each of them showing a cross sectional configuration in correspondence with FIG. 1. Also, FIGS. 8A and 8B illustrate a supply method and supply range of the immersion liquid. FIG. 8A shows a cross sectional configuration of a stepper 6 and FIG. 8B shows a supply range 30 of an immersion liquid 7. Below, for example, the case is explained where an exposure region on the substrate used for immersion lithography process is divided into a plurality of the exposure regions, and each exposure region is exposed in order.

When manufacturing the substrate used for immersion lithography process, as shown in FIG. 4, photoresist (not shown) is applied on the surface of the substructure 1. After that, the photoresist film 2 having a low surface tension is formed in the periphery region RP and the central region RC by heating (baking) the photoresist, if necessary. In this case, the substructure 1 may have a low surface tension or high surface tension.

Next, as shown in FIG. 5, a mask 3 having an opening 3K is disposed on the photoresist 2. After that, using a surface tension activator 4, the process to increase the surface tension is performed onto the surface of the photoresist film 2 in the central region RC. The process to increase the surface tension is a treatment which modifies the surface to increase the surface tension. As the surface tension activator 4, for example, gas including ozone ($O_3$) (such as ozone gas) and a solution (such as ozone water) are used. In this case, the mask 3 is aligned in position with the photoresist film 2 so that the opening region of the opening 3K corresponds to the central region RC.

By the process to increase the surface tension, the surface of the photoresist film 2 in the central region RC is exposed to the surface tension activator 4 via the opening 3K of the mask 3 so that the surface is modified (for example, oxidized). After that, by removing the mask 3 and the surface tension activator 4, the surface tension of the photoresist film 2 in the central region RC is increased in comparison with before performing the process to increase the surface tension, as shown in FIG. 1. Thus the surface tension TC becomes higher than the surface tension TP. Accordingly, the surface tension TP of the photoresist film 2 in the periphery region RP becomes lower than the surface tension TC of the photoresist film 2 in the central region RC (TP Low and TC High). This completes the substrate used for immersion lithography process.

When performing immersion lithography using the substrate used for immersion lithography process, the stepper 6 having a projection lens 5 is disposed with a predetermined distance away from the photoresist film 2 as shown in FIG. 6. In this case, the stepper 6 is aligned in position so as to correspond to one exposure region of a plurality of exposure regions (the region that is exposed first). Also, the distance between the photoresist film 2 and stepper 6 is set based on the exposure conditions in the exposure process in the post process.

Next, the immersion liquid 7 is supplied between the photoresist film 2 and the stepper 6. The immersion is completed by a contact of the photoresist film 2 and the stepper 6 with the immersion liquid 7. As the immersion liquid 7, for example, pure water or the like is used. When supplying the immersion liquid 7, for example as in FIGS. 8A and 8B, the stepper 6 having a supply function of the immersion liquid 7 is used and the supply range 30 of the immersion liquid 7 becomes larger than the one of the exposure regions.

As shown in FIG. 8A, the stepper 6 has an optical system 21 equipped with the projection lens 5 described above, and a supply and drainage system 22 having a supply conduit 22N and a drainage conduit 22T. The stepper 6 is capable of exposing via the projection lens 5 while the immersion liquid 7 is supplied through the supply conduit 22N and drainage conduit 22T. In the stepper 6, the positional relationship between the supply conduit 22N and the drainage conduit 22T may be opposite. The stepper 6 is, for example, used in the state such that the optical system 21 fits in the opening 23 provided between the supply conduit 22N and the drainage conduit 22T of the supply and drainage system 22. In addition, the projection lens 5 described above is a typical example of a component of the stepper 6. Needless to say, the stepper 6 also has other components (for example, a light source to emit an exposure light L that will be described later, and a tank or a pump to store the immersion liquid 7).

As in FIG. 8B, the supply range 30 of the immersion liquid 7 includes the central range 31 (the darkly shaded region in FIG. 8B) corresponding to the exposure region, and a periphery range 32A and a periphery range 32B (the lightly shaded regions in FIG. 8B). That is, the immersion liquid 7 is supplied to not only the central range 31 but also the periphery ranges 32A and 32B so that the immersion liquid 7 surely fills the whole area of the central range 31.

Here, the immersion liquid 7 is supplied to the periphery range 32A, or to the periphery range 32A and the periphery range 32B as well. This depends on the surface tension (wetting of the immersion liquid 7 is good or poor) of the substrate used for immersion lithography process to which the immersion liquid 7 is supplied. Specifically, in case the surface tension is the high surface tension over the whole area of the substrate used for immersion lithography process, the immersion liquid 7 is supplied to the periphery range 32B as well so that the central range 31 and the periphery ranges 32A and 32B are covered by the immersion liquid 7. On the other hand, in case the surface tension of the substrate used for immersion lithography process is the low surface tension over the whole area, the immersion liquid 7 is supplied to the periphery range 32A so that the central range 31 and the periphery range 32A are covered by the immersion liquid 7.

Because the surface tension TP is lower than the surface tension TC in the immersion state, the following effects can be obtained due to the difference of the surface tensions. That is, in the periphery region RP having a low surface tension (TP Low), the immersion liquid 7 hardly flows from the central region RC to the periphery region RP so that the immersion liquid hardly leaks out. On the other hand, in the central region RC having a high surface tension (TC High), the bubbles hardly get into between the photoresist film 2 and the immersion liquid 7 so that the bubbles hardly occur in the immersion liquid 7.

Finally, as shown in FIG. 7, the photoresist 2 is exposed (performing immersion lithography) by applying the exposure light L to the photoresist film 2 through the immersion liquid 7. In this case, as shown in FIG. 8B, the substrate used for immersion lithography process is moved in the x-axis direction or the y-axis direction against the stepper 6 and each exposure region is exposed in order while the immersion liquid 7 is supplied every time the substrate used for immersion lithography process is moved so that all the exposure regions are exposed. In addition, a region 33 and a region 34 indicated by broken lines on the supply range 30 of the immersion liquid 7 in FIG. 8B show a supply position and a drainage position of the immersion liquid 7 in case of moving the substrate used for immersion lithography process in the x-axis direction, respectively. Similarly, the regions 35 and 36 indicated by broken lines show supply and drainage positions of the immersion liquid 7 in case of moving the substrate used for immersion lithography process in the y-axis direction, respectively. The supply position indicates the position where the immersion liquid 7 is supplied through the supply conduit 22N and the drainage position indicates the position where the immersion liquid 7 is drained through the drainage conduit 22T. In addition, the positional relationship between the supply conduit 22N and the drainage conduit 22T may be opposite according to the moving direction of the substrate used for immersion lithography process.

In the exposure process, when the exposure light L emitted from a light source (not shown) in the stepper 6 is condensed by the projection lens 5, the exposure light L is applied to the photoresist film 2 through the immersion liquid 7. In this case, the resolution=$k \times \lambda / NA$ and $NA = n \times \sin \theta$, where the wavelength of the light L is $\lambda$, an incidence angle of the light L is $\theta$, a refractive index of the immersion liquid 7 is n, a numeric aperture of the projection lens 5 is NA, and a process coefficient is k. As an example, in case of using pure water (refractive index n=1.44) as the immersion liquid 7, the apparent exposure wavelength is 1.00/1.44 times longer in comparison with the case of exposing through the air (refractive index n=1.00) without filling the immersion liquid 7 between the photoresist film 2 and the stepper 6. Thus the resolution index improves by 1.00/1.44 times.

This completes immersion lithography. After this, the photoresist film 2 after exposure is developed using a developer so that patterning is performed onto the photoresist film 2.

In the substrate used for immersion lithography process and the method of manufacturing thereof, and immersion lithography according to the embodiment of the present invention, after the photoresist film 2 having the low surface tension is formed, the process to increase the surface tension is performed onto the photoresist film 2 in the central region RC. Thus the surface tension TP becomes lower than the surface tension TC, before the immersion is completed. In this case, as described above, due to the difference of the surface tensions between the periphery region RP and the central region RC, the immersion liquid 7 hardly leaks out and the bubbles hardly occur in the immersion liquid 7. Moreover, unlike the case where the mixed substance having the low surface tension is formed between the photoresist film and immersion liquid, a desirable surface tension is easily obtained because only the surface modification (process to increase the surface tension) showing a good reproductivity is performed to control the surface tensions TP and TC. Also, after the immersion is completed, the surface tensions TP and TC are unnecessary to be adjusted. Thus the immersion lithography process can be simplified. Accordingly, in the embodiment of the present invention, immersion lithography can be easily performed with stability and high precision.

Figure 9:
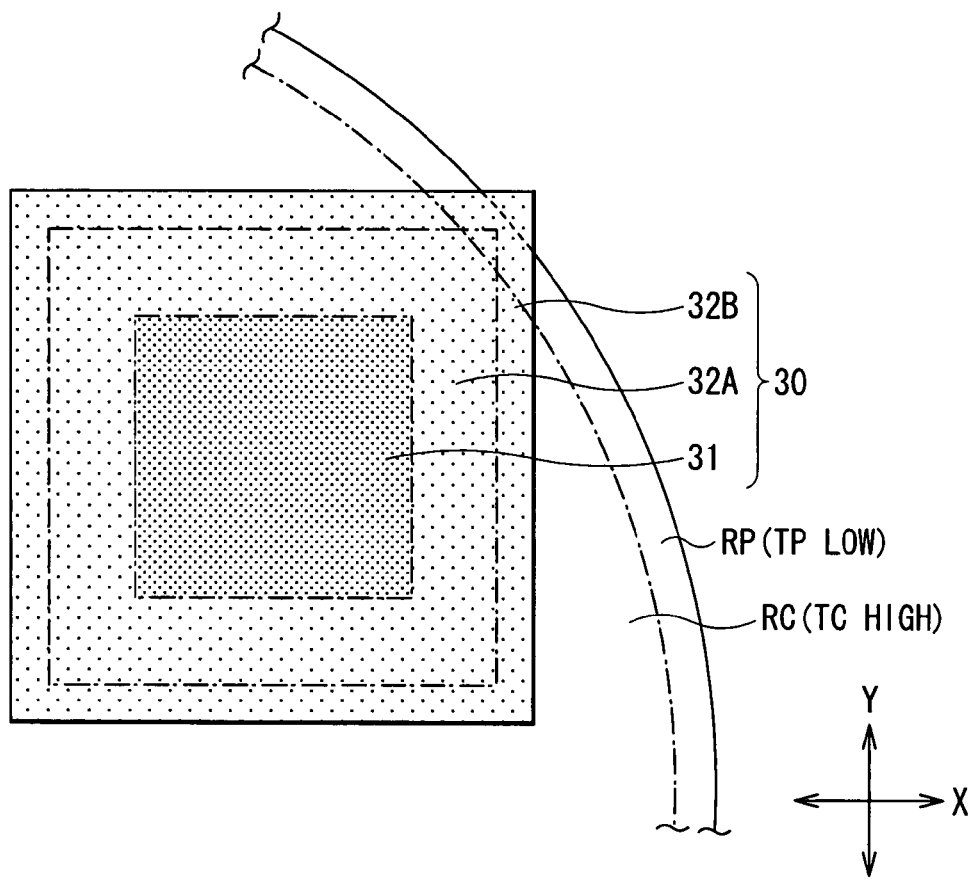
FIG. 9 is a plan view illustrating advantages of immersion lithography using the substrate used for immersion lithography process.

According to the embodiment of the present invention, because the periphery region RP of the substrate used for immersion lithography process has the low surface tension (TP Low) and the central region RC has the high surface tension (TC High), the following advantages can be obtained. FIG. 9 is a plan view to explain advantages of immersion lithography using the substrate used for immersion lithography process in correspondence with FIGS. 2 and 8B. In FIG. 9, to simplify the view, curved lines are partially shown that are necessary to define the periphery region RP and central region RC in the substrate used for immersion lithography process.

In case each exposure region on the substrate used for immersion lithography process is exposed in order, when the exposure region is located close to the edge of the substrate used for immersion lithography process, the whole supply range 30 of the immersion liquid 7 is not located on the effective region of the substrate used for immersion lithography process as shown in FIG. 9. That is, the supply range 30 likely sticks out of the substrate used for immersion lithography process. In this case, when both of the periphery region RP and the central region RC have the low surface tension, only the central range 31 and periphery range 32A are covered by the immersion liquid 7 (the supply range 30 stays on the substrate used for immersion lithography process) so that the immersion liquid 7 does not narrowly leaks out but the bubbles easily occur in the immersion liquid 7. Also, when both of the periphery region RP and the central region RC have the high surface tension, though the bubbles hardly occur in the immersion liquid 7, not only the central range 31 and the periphery range 32A but also the periphery range 32B are covered by the immersion liquid 7 (the supply range 30 sticks out of the substrate used for immersion lithography process) so that the immersion liquid leaks out. To prevent leakage, the supply range 30 is shifted to the left below to locate the supply range 30 on the substrate used for immersion lithography process. However, this is unpreferable as causing a decrease in the number of the exposure regions on the substrate used for immersion lithography process in this case. On the other hand, in the embodiment, the periphery region RP has the low surface tension and the central region RC has the high surface tension. Thus in the central region RC, up to the periphery range 32B is covered by the immersion liquid 7, but in the periphery region RP, only up to the periphery range 32A is covered by the immersion liquid 7. Therefore, the bubbles hardly occur in the immersion liquid 7 and the immersion liquid 7 hardly leaks out. As a result, immersion lithography can be performed appropriately without decreasing the number of exposure regions on the substrate used for immersion lithography process.

In the embodiment, in case the exposure region on the substrate used for immersion lithography process is exposed, the exposure region is divided into a plurality of the exposure regions and each exposure region is exposed in order while the immersion liquid 7 is supplied. However, it is not necessarily limited to this. For example, without dividing the exposure region into a plurality of exposure regions, the whole exposure region may be exposed at once while the immersion liquid 7 is supplied. In this case, the same effects also can be obtained.

Second Embodiment

Figure 10:
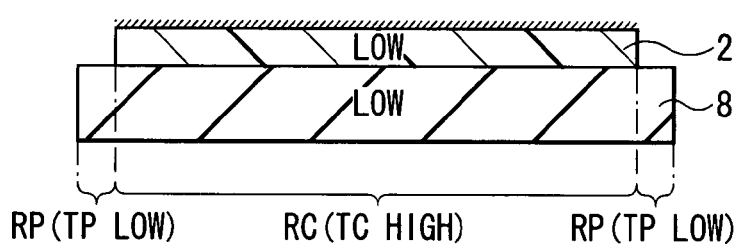
FIG. 10 is a cross sectional view showing a configuration of the substrate used for immersion lithography process according to a second embodiment of the present invention.
Figure 11:
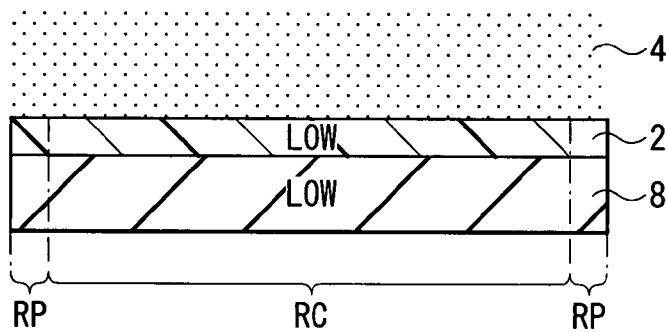
FIG. 11 is a cross sectional view illustrating the method of manufacturing the substrate used for immersion lithography process shown in FIG. 10.
Figure 12:
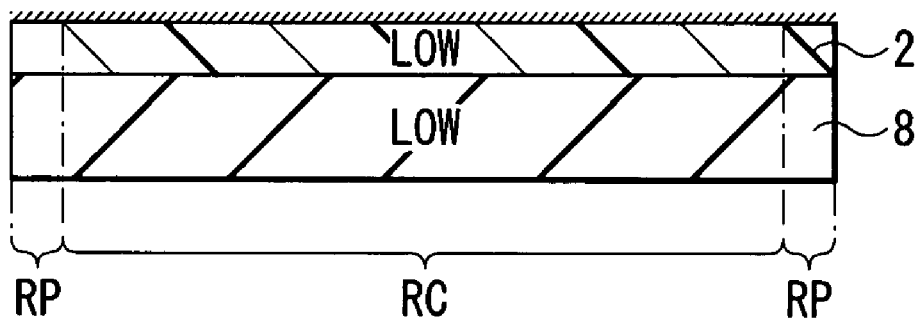
FIG. 12 is a cross sectional view illustrating a step following FIG. 11.
Figure 13:
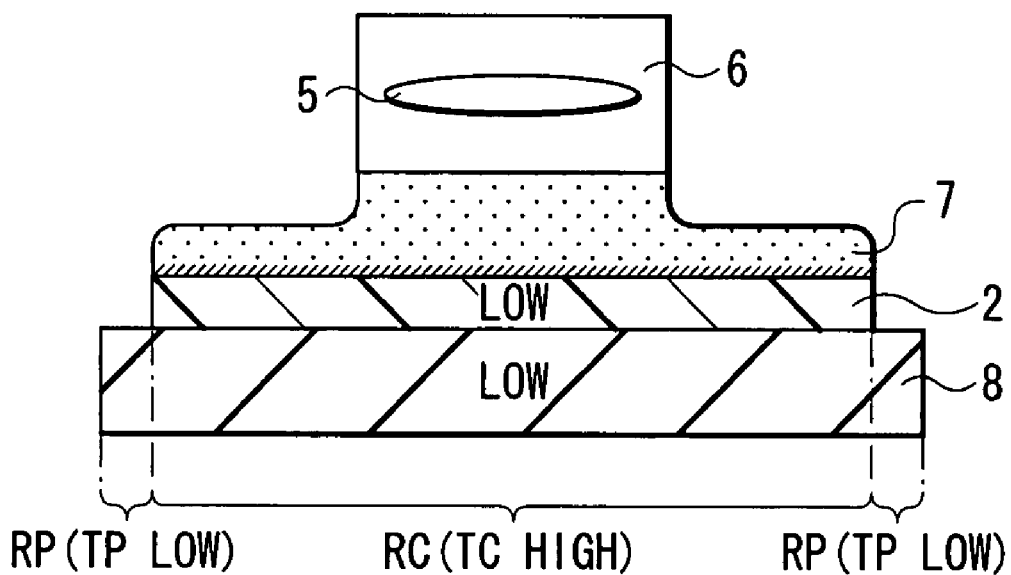
FIG. 13 is a cross sectional view illustrating a step in immersion lithography using the substrate used for immersion lithography process shown in FIG. 10.

Next, with reference to FIGS. 10 to 13, a substrate used for immersion lithography process and a method of manufacturing thereof, and immersion lithography will be described according to a second embodiment of the present invention. FIG. 10 shows a configuration of the substrate used for immersion lithography process, FIGS. 11 and 12 show the process of manufacturing the substrate used for immersion lithography process, and FIG. 13 shows the immersion lithography process, each of them showing a cross sectional configuration corresponding to FIG. 1. In FIGS. 10 to 13, same reference numerals have been used as same components in the above-mentioned first embodiment of the present invention.

The substrate used for immersion lithography process in the second embodiment has the same configuration and surface tension properties as the substrate used for immersion lithography process descried in the first embodiment, except the points described below. That is, as shown in FIG. 10, a substructure 8 originally having a low surface tension is provided. A photoresist film 2 is provided on the substructure 8 in a central region RC. The substructure 8 is partially exposed in a periphery region RP. The photoresist film 2 originally has a low surface tension as described in the first embodiment, but the surface is modified to have a high surface tension. From this, a surface tension TP of the exposed surface of the substructure 8 in the periphery region RP becomes lower than a surface tension TC of the photoresist film 2 in the central region RC. (TP Low and TC High)

When manufacturing the substrate used for immersion lithography process and performing immersion lithography, the substructure 8 having the low surface tension is prepared, and the photoresist film 2 having the low surface tension is formed on the substructure 8 in the periphery region RP and the central region RC as shown in FIG. 11 by the steps described in the first embodiment with reference to FIG. 4.

Next, using the surface tension activator 4, the process to increase the surface tension is performed onto the surface of the photoresist film 2 in the periphery region RP and the central region RC. Thus, the photoresist film 2 has the high surface tension as in FIG. 12.

Next, using organic solvents or the like, the photoresist film 2 in the periphery region RP is removed (namely, edge rinsed) so that the substructure 8 having the low surface tension is partially exposed as in FIG. 10. As the organic solvents, for example, ethyl methyl ketone, acetone, methyl isobutyl ketone, toluene, ethyl acetate, tetrahydrofuran, propylene glycol monomethylether acetate, isopropyl alcohol and the like are used. Therefore, the surface tension TP of the exposed surface of the substructure 8 in the periphery region RP becomes lower than the surface tension TC of the photoresist film 2 in the central region RC. This completes the substrate used for immersion lithography process.

Finally, as shown in FIG. 13, the immersion liquid 7 is supplied between the photoresist film 2 and the stepper 6, and the photoresist film 2 is exposed by the steps described in the first embodiment with reference to FIG. 7. This completes the immersion lithography.

In the substrate used for immersion lithography process, the method of manufacturing thereof, and immersion lithography according to the embodiment, the photoresist film 2 having the low surface tension is formed on the substructure 8 in the periphery region RP and the central region RC having the low surface tension. After the process to increase the surface tension is performed onto the photoresist film 2, the substructure 8 is partially exposed by removing the photoresist film 2 in the periphery region RP. Thus, the surface tension TP becomes lower than the surface tension TC, before the immersion is completed, as described above. Thus, because the same effects can be obtained as in the first embodiment, immersion lithography can be performed with stability and high precision. In addition, the configuration, manufacturing process, exposure process, effects and modifications according to the second embodiment other than described above are same as in the first embodiment.

Third Embodiment

Figure 14:
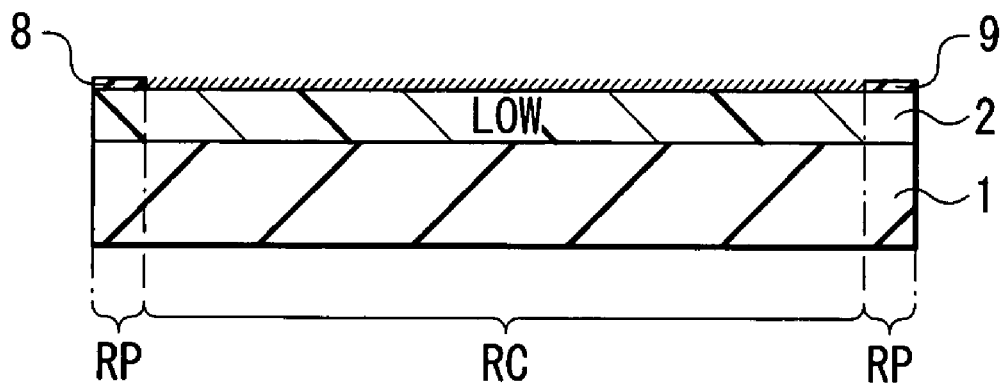
FIG. 14 is a cross sectional view showing a configuration and the method of manufacturing the substrate used for immersion lithography process according to a third embodiment of the present invention.
Figure 15:
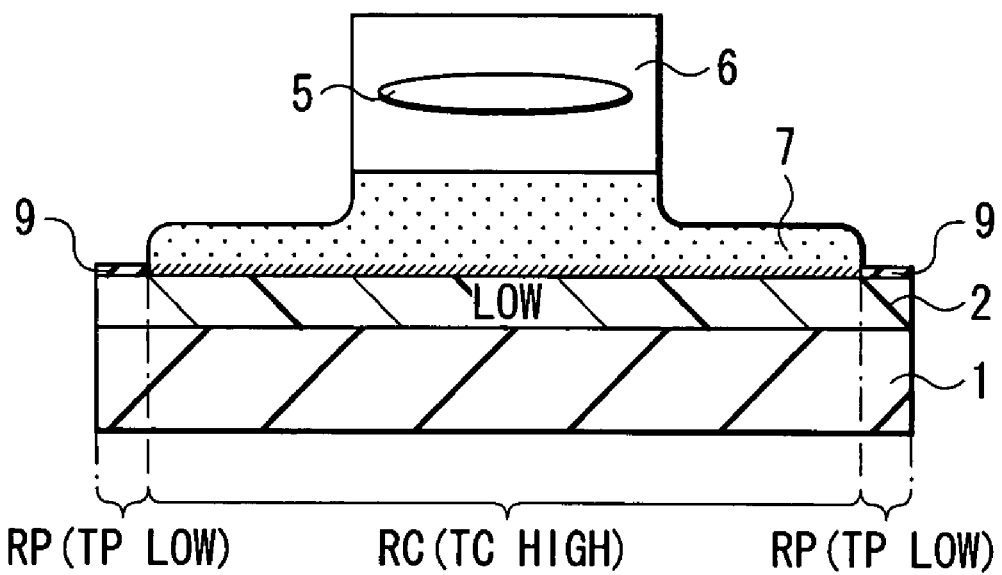
FIG. 15 is a cross sectional view illustrating immersion lithography using the substrate used for immersion lithography process shown in FIG. 14.

Next, with reference to FIGS. 14 and 15, an substrate used for immersion lithography process and a method of manufacturing thereof, and immersion lithography according to a third embodiment will be described. FIG. 14 shows a configuration of the substrate used for immersion lithography process and the method of manufacturing thereof, and FIG. 15 shows the immersion lithography process, each of them showing a cross sectional configuration corresponding to FIG. 1. In FIGS. 14 and 15, same reference numerals have been used as same components in the above-mentioned first embodiment of the present invention.

The substrate used for immersion lithography process in the third embodiment has the same configuration and surface tension properties as the substrate used for immersion lithography process described in the first embodiment, except the following points. That is, as shown in FIG. 14, a surface tension decreasing film 9 having a surface tension lower than that of a photoresist film 2 in a central region RC is formed on the photoresist film 2 in a periphery region RP. The photoresist film 2 originally has a low surface tension as described in the first embodiment, but the surface is modified to have a high surface tension. In the first embodiment, only the surface of the photoresist film 2 in the central region RC is modified by performing the process to increase the surface tension and the surface of the photoresist film 2 in the periphery region RP is unmodified. However, in the third embodiment, because a surface tension TP is determined by the surface tension decreasing film 9, the surface tension of the photoresist film 2 in the periphery region RP may be modified or unmodified. Thus the surface tension TP of the surface tension decreasing film 9 in the periphery region RP becomes lower than a surface tension TC of the photoresist film 2 in the central region RC (TP Low and TC High).

The surface tension decreasing film 9 is composed of at least one selected from the group consisting of fluororesin and silicon resin. Fluororesin is a general term of resin such that a hydrogen atom is partially or wholly substituted with a fluorine atom. For example, it is vinylidene fluoride-tetrafluoroethylene copolymer, ethylene-tetrafluoroethylene copolymer, polychlorotrifluoroethylene, tetrafluoroethylene-hexafluoropropylene copolymer, tetrafluoroethylene-perfluoro alkylvinylether copolymer, perfluorooctanoic sulfonate acetate or the like. Also, silicon resin is a general term of resin including siloxane bonds such as polysilsesquioxane, polymethylsilsesquioxane, polyphenylsilsesquioxane, polyvinylmethylsilsesquioxane, polyphenylmethylsilsesquioxane, polyphenylpropylsilsesquioxane, polymethyl-n-hexylsilsesquioxane, polyphenylmethacryloxypropylsilsesquioxane or the like.

When manufacturing the substrate used for immersion lithography process and performing immersion lithography, the photoresist film 2 having the low surface tension is formed on the substructure 1 in the periphery region RP and the central region RC 1 as in FIG. 14, by the steps described in the second embodiment with reference to FIGS. 11 and 12. After that, the process to increase the surface tension is performed onto the photoresist film 2.

Next, the surface tension decreasing film 9 is formed on the photoresist film 2 in the periphery region RP where the process to increase the surface tension has been performed. When forming the surface tension decreasing film 9, surface tension decreasing materials such as fluororesin and silicon resin are applied and dried in order to make it into a film. Thus the surface tension TP of the surface tension decreasing film 9 in the periphery region RP becomes lower than the surface tension TC of the photoresist film 2 in the central region RC. This completes the substrate used for immersion lithography process.

Finally, as shown in FIG. 15, an immersion liquid 7 is supplied between the photoresist film 2 and a stepper 6. After that, the photoresist film 2 is exposed by the steps described in the first embodiment with reference to FIG. 7. This completes immersion lithography.

In the substrate used for immersion lithography process and the method of manufacturing thereof, and immersion lithography according to the third embodiment, the photoresist film 2 having the low surface tension is formed. After performing the process to increase the surface tension on the photoresist film 2 in the periphery region RP and the central region RC, the surface tension decreasing film 9 is formed on the photoresist film 2 in the periphery region RP. Thus the surface tension TP becomes lower than the surface tension TC, before the immersion is completed, as described above. Moreover, in order to control the surface tensions TP and TC, only the formation of the surface tension decreasing film 9 showing a good reproductivity is performed. Therefore, because the same effects can be obtained as in the first embodiment, immersion lithography can be easily performed with high precision and stability. In addition, the configuration, manufacturing process, exposure process, effects and modifications according to the third embodiment other than described above are same as in the first embodiment.

Fourth Embodiment

Figure 16:
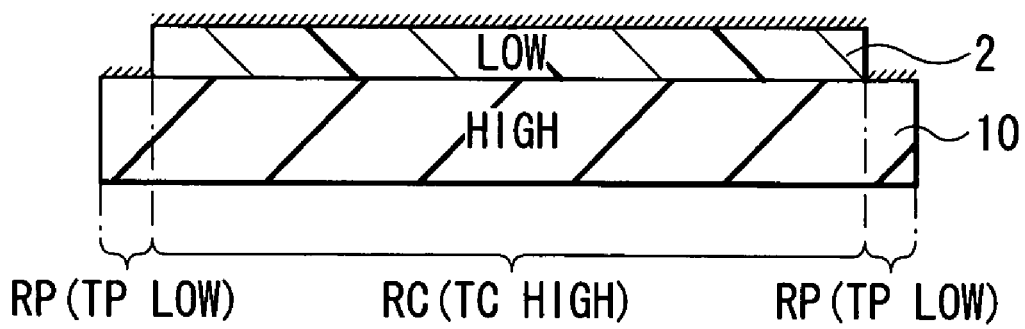
FIG. 16 is a cross sectional view showing a configuration of the substrate used for immersion lithography process according to a fourth embodiment of the present invention.

Next, with reference to FIGS. 16 to 21, an substrate used for immersion lithography process and a method of manufacturing thereof, and immersion lithography according to the fourth embodiment of the present invention will be described. FIG. 16 shows a configuration of the substrate used for immersion lithography process, FIGS. 17, 19, 20, and 21 show a process of manufacturing the substrate used for immersion lithography process, and FIGS. 18A and 18B show the immersion lithography process, each of them showing a cross sectional configuration corresponding to FIG. 1. In FIGS. 16 to 21, same reference numerals have been used as same components in the above-mentioned first embodiment of the present invention.

The substrate used for immersion lithography process in the fourth embodiment has the same configuration and surface tension properties as the substrate used for immersion lithography process described in the first embodiment, except the following points. That is, the substrate used for immersion lithography process includes a substructure 10 originally having a high surface tension as in FIG. 16. A photoresist film 2 is formed on the substructure 10 in a central region RC while the substructure 10 is partially exposed in a periphery region RP. The substructure 10 originally has the high surface tension as described above, but the exposed surface is modified to have the surface tension lower than that of the photoresist film 2 in the central region RC. The photoresist film 2 originally has a low surface tension as described in the first embodiment, but the surface is modified to have the high surface tension. From this, a surface tension TP of the substructure 10 in the periphery region RP becomes lower than a surface tension TC of the photoresist film 2 in the central region RC (TP Low and TC High).

When manufacturing the substrate used for immersion lithography process and performing immersion lithography, the substructure 10 having the high surface tension is prepared. The photoresist film 2 having the low surface tension is formed on the substructure 10 in the periphery region RP and the central region RC by the steps described in the first embodiment with reference to FIG. 4. Next, the process to increase the surface tension is performed onto the photoresist film 2 in the periphery region RP and the central region RC by the steps described in the second embodiment with reference to FIGS. 11 and 12. Therefore the photoresist film 2 has the high surface tension.

Figure 17:
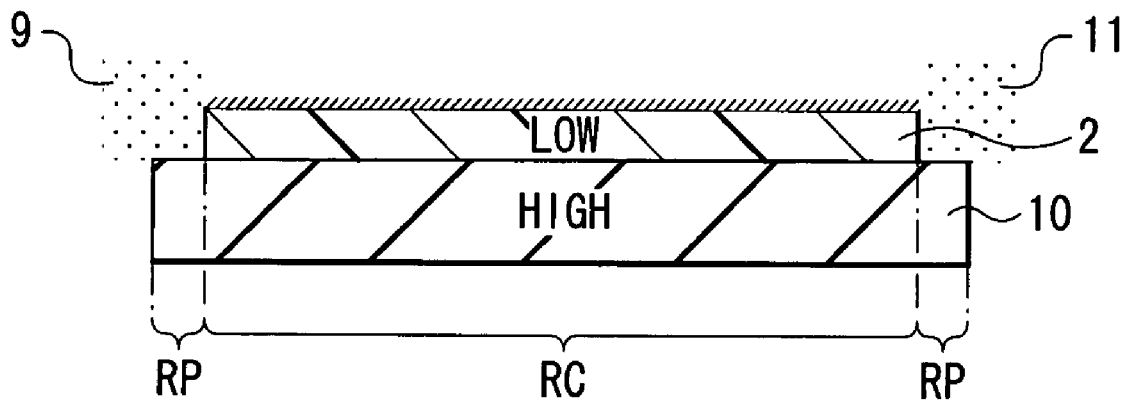
FIG. 17 is a cross sectional view illustrating the method of manufacturing the substrate used for immersion lithography process shown in FIG. 16.
Figure 18:
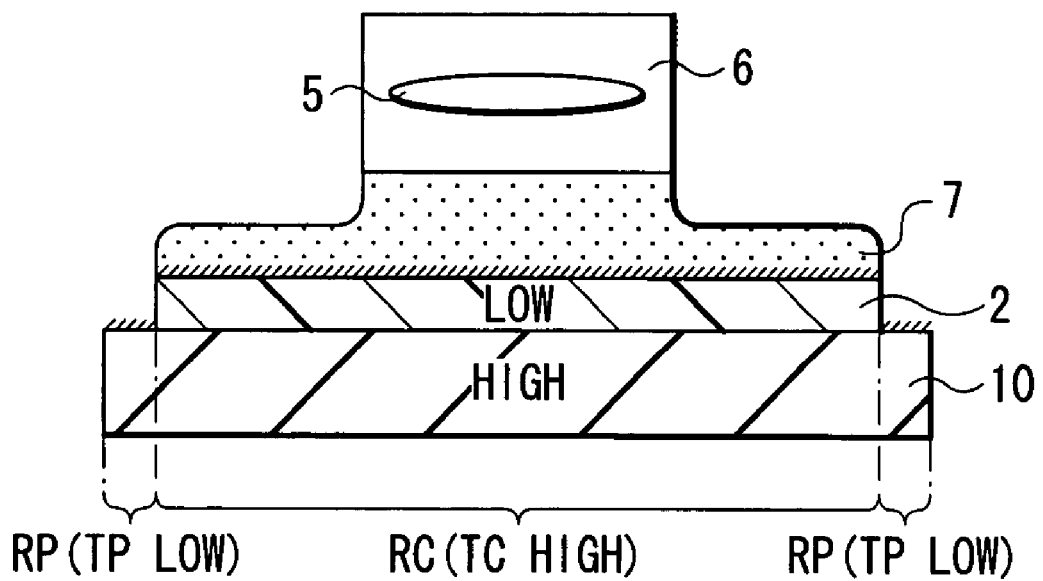
FIG. 18 is a cross sectional view illustrating immersion lithography using the substrate used for immersion lithography process shown in FIG. 16.

Next, as shown in FIG. 17, the photoresist film 2 in the periphery region RP is removed using a surface tension depressant 11 including surface tension decreasing materials. The surface tension depressant 11 uses surface tension decreasing materials as solute capable of decreasing the surface tension of the substructure 10. The surface tension depressant 11 is a solution of water or organic solvent capable of removing the photoresist film 2. The surface tension decreasing materials may be dissolved into water or organic solvent, or may be dispersed as particulate. For example, the same materials of the surface decreasing film 9 described in the third embodiment are used as the surface tension decreasing materials. Also, the same organic solvents described in the second embodiment are used as the organic solvents.

The photoresist film 2 in the periphery region RP is removed using the surface tension depressant 11. Thus the substructure 10 having the high surface tension is exposed and the process to decrease the surface tension is performed onto the exposed surface of the substructure 10. The exposed surface of the substructure 10 is modified to have the surface tension lower than that of the photoresist film 2 in the central region RC and therefore the surface of the substructure 10 has the low surface tension. From this, as shown in FIG. 16, the surface tension TP of the substructure 10 in the periphery region RP becomes lower than the surface tension TC of the photoresist film 2 in the central region RC. This completes the substrate used for immersion lithography process.

Finally, as shown in FIGS. 18A and 18B, an immersion liquid 7 is supplied between the photoresist film 2 and a stepper 6. After that, the photoresist film 2 is exposed by the steps described in the first embodiment with reference to FIG. 7. This completes immersion lithography.

In the substrate used for immersion lithography process and the method of manufacturing thereof, and immersion lithography according to the fourth embodiment, the photoresist film 2 having the low surface tension is formed on the substructure 10 in the periphery region RP and the central region RC, the substructure 10 having the high surface tension. The process to increase the surface tension is performed onto the photoresist film 2 in the periphery region RP and the central region RC. After that, the photoresist film 2 in the periphery region RP is removed using the surface tension depressant 11 to partially expose the substructure 10. Then the surface tension of the exposed surface of the substructure 10 is decreased. Thus the surface tension TP becomes lower than the surface tension TC, before the immersion is completed, as described above. Moreover, in order to control the surface tensions TP and TC, only the surface modification (process to decrease the surface tension) showing a good reproductivity is performed. Therefore, because the same effects can be obtained as in the first embodiment, immersion lithography can be easily performed with high precision and stability. In addition, the configuration, manufacturing process, exposure process, effects and modifications according to the fourth embodiment other than described above are same as in the first embodiment.

Especially in the fourth embodiment, when setting the surface tension TP in the periphery region RP based on the surface tension of the substructure 10, although the substructure 10 originally has the high surface tension, the exposed surface of the substructure 10 is modified to have the low surface tension by performing the process to decrease the surface tension using the surface tension depressant 11. Therefore the substructure originally having the low surface tension is not necessarily used so that the substructure can be selected more widely.

Figure 19:
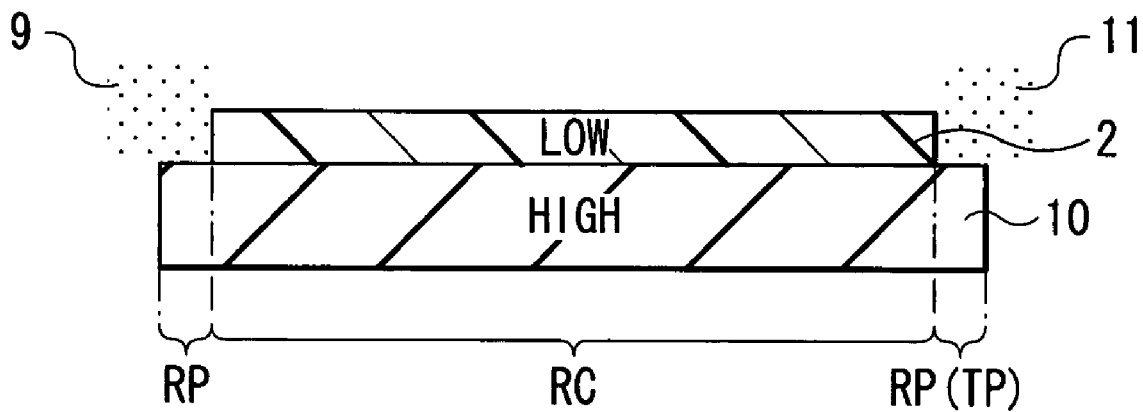
FIG. 19 is a cross sectional view illustrating a step in a modification with respect to the method of manufacturing the substrate used for immersion lithography process according to a fourth embodiment of the present invention.
Figure 20:
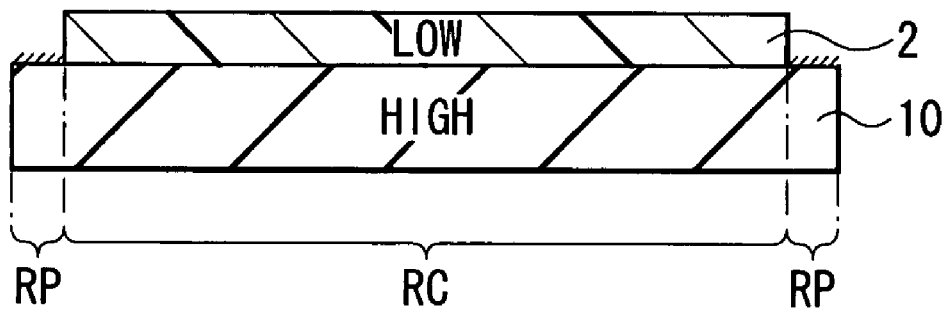
FIG. 20 is a cross sectional view illustrating a step following FIG. 19
Figure 21:
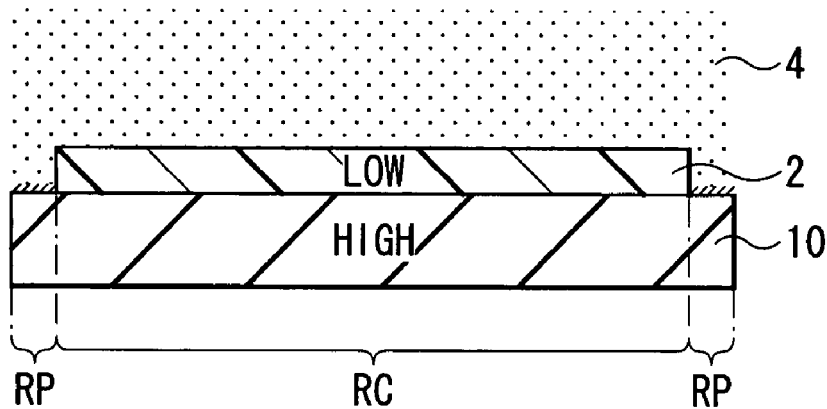
FIG. 21 is a cross sectional view illustrating a step following FIG. 20.

In the fourth embodiment as shown in FIG. 17, to manufacture the substrate used for immersion lithography process, the photoresist film 2 is removed (process to decrease the surface tension) after the process to increase the surface tension is performed. However, it is not necessarily limited to this. For example as shown in FIGS. 19 to 21, the process to increase the surface tension may be performed after removing the photoresist film 2. In this case, the substructure 10 having the high surface tension is prepared. The photoresist film 2 having the low surface tension is formed on the substructure 10 in the periphery region RP and the central region RC by the steps described in the first embodiment with reference to FIG. 4. Next, by removing the photoresist film 2 in the periphery region RP using the surface tension depressant 11 as in FIG. 19, the substructure 10 in the periphery region RP is partially exposed as in FIG. 20 and the exposed surface of the substructure 10 has the low surface tension. Next, as shown in FIG. 21, the process to increase the surface tension is performed onto the photoresist film 2 in the periphery region RP and the central region RC using a surface tension activator 4. Thus the photoresist film 2 in the central region RC has the high surface tension as shown in FIG. 16. The process to increase the surface tension is performed in the central region RC and in the periphery region RP of the photoresist film 2 as well. However, the exposed surface of the substructure 10 in the periphery region RP is modified to have the low surface tension by removing (process to decrease the surface tension) in the previous step so that the low surface tension is successively kept. This completes the substrate used for immersion lithography process as in FIG. 16. Also in this case, the same effects as in the above embodiment can be obtained.

Fifth Embodiment

Figure 22:
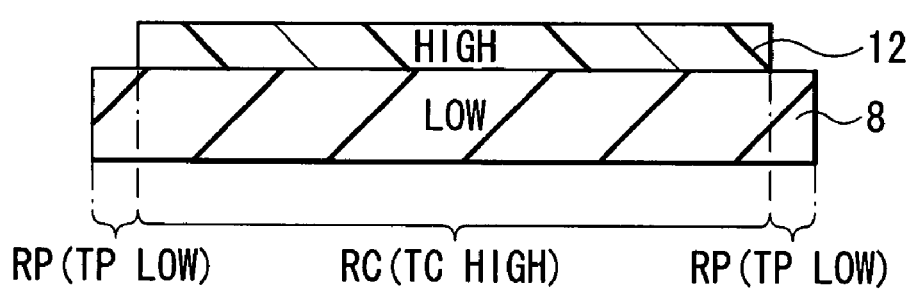
FIG. 22 is a cross sectional view showing a configuration of the substrate used for immersion lithography process according to a fifth embodiment of the present invention.

Next, with reference to FIG. 22, an substrate used for immersion lithography process and a method of manufacturing thereof, and immersion lithography according to a fifth embodiment will be described. FIG. 22 illustrates a configuration and a method of manufacturing the substrate used for immersion lithography process, each of them showing a cross sectional configuration corresponding to FIG. 1. In FIG. 22, same reference numerals have been used as same components in the above-mentioned first embodiment of the present invention.

Unlike the first to fourth embodiments where a photoresist film 2 originally having a low surface tension is used, the substrate used for immersion lithography process in the fifth embodiment uses a photoresist film 12 originally having a high surface tension. The substrate used for immersion lithography process in the fifth embodiment has the same configuration and surface tension properties as the substrate used for immersion lithography process descried in the first embodiment, except the points described below. That is, as shown in FIG. 22, the substrate used for immersion lithography process includes a substructure 8 originally having the low surface tension and the photoresist film 12 is formed on the substructure 8 in a central region RC. The substructure 8 is partially exposed in a periphery region RP. From this, a surface tension TP of the substructure 8 in the periphery region RP becomes lower than a surface tension TC of the photoresist film 12 in the central region RC. (TP Low and TC High)

The method of manufacturing the substrate used for immersion lithography process and the immersion lithography process using thereof are the same as in the first embodiment except the point that the photoresist film 12 originally having the high surface tension is formed on the substructure 8 in the central region RC, the substructure 8 originally having the low surface tension.

In the substrate used for immersion lithography process and the method of manufacturing thereof, and immersion lithography according to the fifth embodiment, the photoresist film 12 having the high surface tension is formed on the substructure 8 in the central region RC, the substructure 8 having a low surface tension. Thus the surface tension TP becomes lower than the surface tension TC, before the immersion is completed. Therefore, because the same effects can be obtained as in the first embodiment, immersion lithography can be easily performed with high precision and stability. In addition, the configuration, manufacturing process, exposure process, effects and modifications according to the fifth embodiment other than described above are same as in the first embodiment.

Especially in the fifth embodiment, the substructure 8 originally having the low surface tension is used and the photoresist film 12 originally having the high surface tension is used as well. Thus, in comparison with the first to fourth embodiments, a complicated process (process to increase the surface tension, formation of the surface tension decreasing film 9 and process to decrease the surface tension) is unnecessary thereby enabling the process of manufacturing the substrate used for immersion lithography process and the immersion lithography process to be simplified.

Next, examples according to the present invention are described.

Example 1

Following the steps below, the substrate used for immersion lithography process according to the first embodiment was manufactured. That is, a substructure 1 (substrate diameter: 6 inches (15.24 cm)) of silicon having a low surface tension was prepared where a sputtering film of tantalum (Ta thickness: 30 nm) was formed over the surface of the substructure 1. First, polyhydroxystyrene resin chemical amplification photoresist was applied on the surface of the substructure 1. By pre-baking at 100□ for 90 seconds, the photoresist film 2 (300 nm in thickness) was formed. Next, a mask 3 having an opening 3K in correspondence with a central region RC was disposed on the photoresist film 2. Finally, using mixed gas of ozone and nitrogen ($N_2$) (ozone content: 50 ppm) as a surface tension activator 4, the process to increase the surface tension was performed onto the surface of photoresist film 2 in the central region RC under the condition that the performance time was 30 seconds and temperature was 23□. From this, the substrate used for immersion lithography process was completed such that the surface tension TP of the periphery region RP was lower than the surface tension TC of the central region RC (TP Low and TC High).

Example 2

Following the same steps described in the example 1 except the steps below, the substrate used for immersion lithography process according to the second embodiment was manufactured. That is, a substructure 8 having a same configuration as the substructure 1 in the example 1 was used to perform the process to increase the surface tension on the surface of the photoresist film 2 in the periphery region RP and the central region RC with the surface tension activator 4. By removing the photoresist film 2 in the periphery region RP using propylene glycol monomethylether acetate (PFGMEA), the substructure 8 in the periphery region RP was partially exposed. In this case, the periphery region RP was set within the range of 1 mm from the outer edge of the substructure 8 toward the inside. Hereinafter, other examples also employed the same.

Example 3

Following the same steps described in the example 1 except the steps below, the substrate used for immersion lithography process according to the third embodiment was manufactured. That is, the process to increase the surface tension was performed onto the photoresist film 2 in the periphery region RP and the central region RC using the surface tension activator 4. By applying isopropyl alcohol (IPA) solution of with 1% of perfluorooctanoic sulfonate Acetate (PFOS) on the surface of the photoresist film 2 in the periphery region RP and drying, the surface tension decreasing film 9 was formed.

Example 4

Following the same steps described in the example 1 except the steps below, the substrate used for immersion lithography process according to the fourth embodiment was manufactured. That is, the substructure 10 (substrate diameter: 6 inches) of silicon having a high surface tension was used where a sputtering film of titanium oxide ($TiO_2$) was formed over the surface of the substructure 10. The photoresist film 2 was formed on the substructure 10 and the process to increase the surface tension was performed onto the photoresist film 2 in the periphery region RP and the central region RC using the surface tension activator 4. After that, the photoresist film 2 in the periphery region RP was removed using PEGMEA solution with 1% of PFOS as the surface tension depressant 11.

Example 5

Following the same steps described in the example 1 except the steps below, the substrate used for immersion lithography process according to a modification of the fourth embodiment was manufactured. That is, the substructure 10 having a high surface tension used in the fourth embodiment was used to form the photoresist film 2 on the substructure 10. After removing the photoresist film 2 in the periphery region RP using the surface tension depressant 11, the process to increase the surface tension was performed onto the photoresist film 2 in the periphery region RP and the central region RC using the surface tension activator 4.

COMPARATIVE EXAMPLE 1

In the comparative example 1, the same steps described in the example 1 were followed except that the process to increase the surface tension was not performed onto the surface of the photoresist film 2 in the central region RC. Thus, the substrate used for immersion lithography process was manufactured such that the surface tension TP of the periphery region RP was equal to the surface tension TC of the central region RC (TP Low and TC Low).

COMPARATIVE EXAMPLE 2

In the comparative example 2, the same steps described in the example 1 were followed except that the process to increase the surface tension was performed onto the surface of the photoresist film 2 in the periphery region RP and the central region RC, without using the mask 3. Thus, an substrate used for immersion lithography process was manufactured such that the surface tension TP of the periphery region RP was equal to the surface tension TC of the central region RC (TP High and TC High).

The results in Table 1 were obtained when the immersion liquid was supplied on the substrates used for immersion lithography of the examples 1 to 5 and the comparative examples 1 and 2 and the condition of the immersion liquid was observed. Table 1 shows the observational result of the immersion liquid and indicates the surface tension properties, presence of bubbles and presence of leakage of the immersion liquid for each substrate used for immersion lithography process. To examine the condition of the immersion liquid, pure water was supplied on the photoresist film as the immersion liquid. Then, whether or not bubbles occurred close to the interface between the photoresist film and the immersion liquid, and whether or not the immersion liquid flowed from the central region RC into the periphery region RP were observed with the naked eye.

TABLE 1

|  | Surface tension properties | Presence of bubbles | Leakage of immersion liquid |
|---|---|---|---|
| Example 1 | TP Low and TC High | Non | Non |
| Example 2 | TP Low and TC High | Non | Non |
| Example 3 | TP Low and TC High | Non | Non |
| Example 4 | TP Low and TC High | Non | Non |
| Example 5 | TP Low and TC High | Non | Non |
| Comparative example 1 | TP Low and TC Low | Occurred | Non |
| Comparative example 2 | TP High and TC High | Non | Occurred |

As understood from the results in Table 1, the bubbles occurred but the immersion liquid did not leak in the comparative example 1 (TP Low and TC Low) where both of the surface tension TP of the periphery region RP and the surface tension TC of the central region RC are the low surface tension. The bubbles did not occur but the immersion liquid leaked out in the comparative example 2 (TP High and TC High) where both of the surface tension TP of the periphery region RP and the surface tension TC of the central region RC are high surface tension. On the other hand, the bubbles did not occur and the immersion liquid did not leak out in all the cases of the examples 1 to 5 where the surface tension TP of the periphery region RP was lower than the surface tension TC of the central region RC (TP Low and TC High). Therefore, it was confirmed that the optical conditions during exposure are not influenced by bubbles and moreover the immersion liquid stayed on the photoresist film, as long as immersion lithography was performed using the substrate used for immersion lithography process according to the present invention. Thus, immersion lithography could be performed with stability and high precision.

Hereinbefore, the present invention is described with the embodiments and examples, but the present invention is not limited to the above embodiments and examples as various modifications are available. Specifically, for example in the above embodiments and examples, the process to increase the surface tension, formation of the surface tension decreasing film 9 and the process to decrease the surface tension are performed in order to manufacture the substrate used for immersion lithography process such that the surface tension TP of the periphery region RP is lower than the surface tension TC of the central region RC, before the immersion is completed. However, it is not limited to this. The performed contents are set arbitrarily as long as the surface tensions TP and TC can be obtained with a desirable relationship of the high surface tension and the low surface tension.

Figure 23:
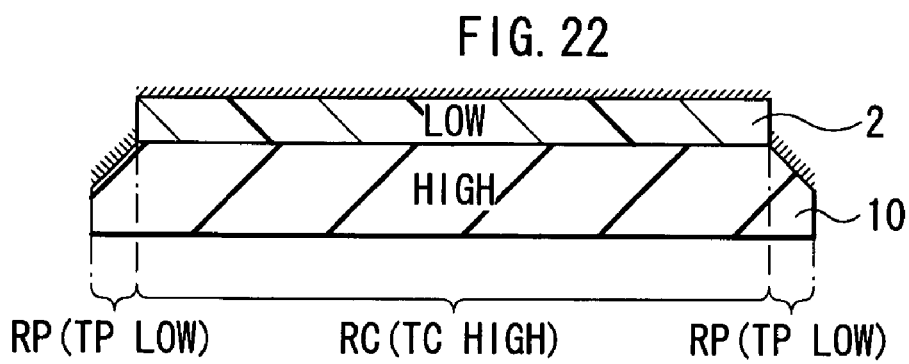
FIG. 23 is a cross sectional view illustrating a modification with respect to a configuration of a substructure.
Figure 24:
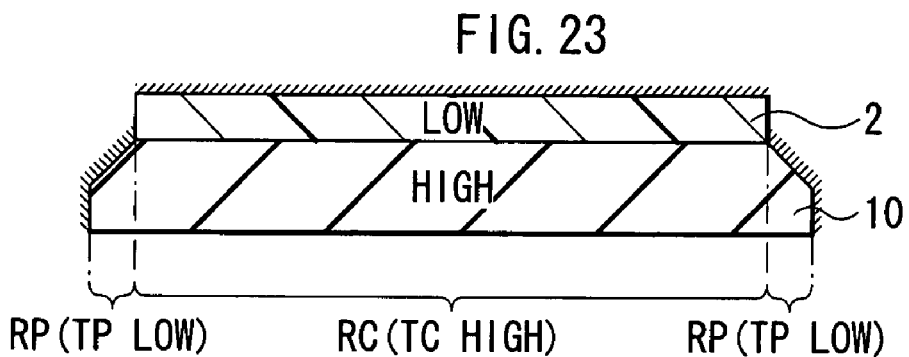
FIG. 24 is a cross sectional view illustrating another modification with respect to a configuration of the substructure.

In the above embodiments, the substructures 1, 8 and 10 are composed to have uniform widths. However, they are not necessarily limited to these. The configurations can be set arbitrarily as long as each of the substructures 1, 8, and 10 has the desired surface tension properties (the low surface tension or the high surface tension). Specifically, in the fourth embodiment (the substructure 10) as an example representing a series of the embodiments, the substructure 10 may be composed such that the thickness in the central region RC is constant and the thickness in the periphery region RP gradually becomes thinner toward the edge. Also in this case, the surface modification is performed onto the exposed surface (slope) of the substructure 10 in the periphery region RP. Further in this case, the surface modification may be performed onto not only the exposed surface of the substructure 10 in the periphery region RP, but also on the side as shown in FIG. 24 corresponding to FIG. 23. Also in these cases, the same effects can be obtained as in the embodiments. The modifications shown in FIGS. 23 and 24 are applicable to the first to third and fifth embodiments (the substructures 1 and 8).

The substrate used for immersion lithography process and the method of manufacturing thereof, and immersion lithography according to the present invention are applicable, for example, to a forming process of fine patterns in the field of manufacturing various devices such as semiconductors and magnetic heads.

Obviously many modifications and variations of the present invention are possible in the light of the above teachings. It is therefore to be understood that within the scope of the appended claims the invention may be practiced otherwise than as specifically described.

What is claimed is:

1. A substrate having a periphery region and a rest region on an upper surface, used for immersion lithography process,
    wherein a photoresist film is formed both in the periphery region and in the rest region,
    a surface of the photoresist film in the rest region is oxidized,
    a surface tension decreasing film is formed on the photoresist film in the periphery region,
    the surface tension decreasing film is composed of at least one selected from the group consisting of fluororesin and silicon resin, and
    a surface tension of the surface tension decreasing film in the periphery region is lower than that of the photoresist film in the rest region.

2. The substrate according to claim 1,
    wherein a magnitude of the surface tension is discontinuous between the surface tension decreasing film in the periphery region and the photoresist film in the rest region.

3. The substrate according to claim 1
    wherein an interfacial tension between the substrate in the periphery region and an immersion liquid is higher than that between the substrate in the rest region and the immersion liquid.

4. The substrate according to claim 1, wherein the rest region is a central region surrounded by the periphery region.

* * * * *